United States Patent [19]

Hiday et al.

[11] 4,118,679
[45] Oct. 3, 1978

[54] VHF, UHF AND SUPERBAND TUNER WITH AUTOMATIC SWITCHING

[75] Inventors: David R. Hiday, Ludlow; Charles G. Larsen, Springfield, both of Mass.

[73] Assignee: General Instrument Corporation, Clifton, N.J.

[21] Appl. No.: 799,349

[22] Filed: May 23, 1977

[51] Int. Cl.² .............................................. H03J 5/26
[52] U.S. Cl. ...................................... 334/1; 325/459; 325/461; 334/11; 334/47
[58] Field of Search ............... 334/1, 11, 47; 325/458, 325/459, 461, 462, 308; 358/86

[56] References Cited

U.S. PATENT DOCUMENTS

| 3,482,178 | 12/1969 | Habian | 334/47 X |
| 3,727,140 | 4/1973 | Nieto et al. | 334/47 X |
| 3,931,578 | 1/1976 | Gittinger | 325/459 X |
| 4,002,986 | 1/1977 | Ma | 325/459 |

Primary Examiner—Paul L. Gensler
Attorney, Agent, or Firm—James & Franklin

[57] ABSTRACT

A combination VHF, UHF and superband tuner, the superband and UHF tuners cooperating with the Channel 1 section of the VHF tuner, is provided with a connection network including voltage sensitive switching devices, such as voltage sensitive diodes, so that selectively energizing a particular desired tuner by applying a supply voltage thereto will automatically effect the appropriate interconnections between the tuning units to render the selected tuner operatively effective and the non-selected tuners non-interfering therewith.

25 Claims, 2 Drawing Figures

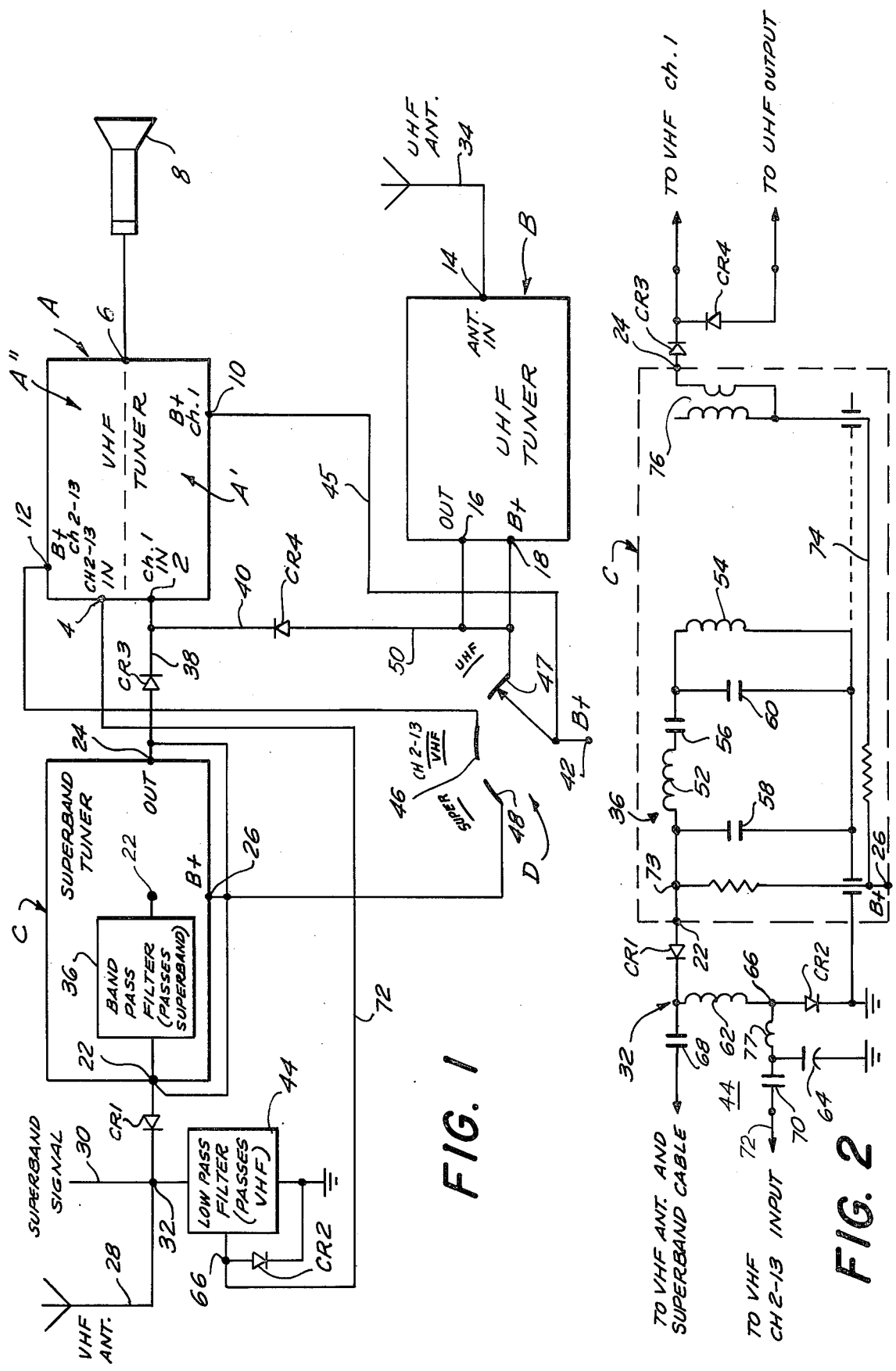

VHF, UHF AND SUPERBAND TUNER WITH AUTOMATIC SWITCHING

BACKGROUND OF THE INVENTION

The present invention relates to a multi-band tuner in which different bands are tuned by different tuning assemblies and in which the selection of the desired tuning assembly to be operative, by applying an energizing voltage thereto, will automatically, by affecting appropriately located voltage-sensitive switching devices such as switching diodes, produce the appropriate electrical connections.

Multi-band tuners have been quite common, particularly in connection with TV reception. Combination VHF-UHF tuners have taken many forms. Sometimes the two tuners are completely independent one from the other, in which case simple switching arrangements are adequate to effect the desired tuner energization and connection. In other instances, in order to minimize the amount of circuitry involved, some portions of the VHF tuner are used in conjunction with the UHF tuner. This complicates the switching arrangement somewhat in connection with selection of one or the other of the tuners to be effective, but because of the simplicity of choices available, the problem has not been particularly troublesome and the instrumentalities employed to effect the switching have presented no problem to the industry.

In recent years, however, and increasingly, a third type of television reception has become prevalent cable television. It has become popular not only in remote areas where commercial television is not readily available, or not readily available in sufficient variety, but also in those areas such as cities, where reception is difficult because of interference or other extraneous factors. It also appeals to many because of the type of programming involved, which can be considerably more mature in nature than that of commercial television. When cable television was in limited demand special tuners for cable television were acceptable, but now that cable television is becoming more generally desired, the need has arisen to provide a single tuning instrumentality capable of detecting and transforming signals either in the VHF, UHF or superband spectrums. Because of the different signal frequencies involved in those three bands or spectrums, the present state of the art mandates using three individual tuning assemblies each usable in only one of those bands or spectrums.

The need to provide three different tuner assemblies in a television set adapted to receive VHF, UHF and superband increases the complexity of the switching arrangements required to energize the desired tuning assembly and prevent the other tuner assemblies from adversely interfering with the operation of the selected assembly. The problems presented are greatly complicated by the economic need to minimize the number of circuits and circuit elements involved, thereby to reduce cost and size and increase reliability. Cable television requires no antenna, but there must be means to introduce the cable signals into the tuner. A section of the existing VHF tuner, such as the normally unused channel 1 section thereof, can be employed to cooperate with the superband tuner in converting the received signal into the viewed television picture. The same channel 1 section is often used in conjunction with UHF tuners, although in a different manner from its use with the superband tuner. Thus as one shifts from one tuner assembly to another there are a significant number of electrical connections which must be shifted.

To accomplish this shifting of electrical connections by means of mechanical switches is of course possible, but not preferred. Mechanical switches are bulky and costly, they require appreciable force to operate, they are often unreliable, and they are comparatively short-lived.

Switching in a fully electrical manner, by means of voltage-sensitive circuit elements such as switching diodes, is known in the art. Electrical switching has the known advantages of speed, small size, low weight, and reliability, as well as the ability to be acted upon from a distance, since all that is required to effect switching is a change in voltage, which can be carried over a lead. However, the very fact that the diodes are actuated by voltage limits their usability, since they can only be incorporated into those circuits where the application of the actuating or switching voltage to the diodes will not adversely affect the main purpose and functions of the circuits involved.

It would be advantageous, particularly from a cost point of view, to provide the VHF signals from the VHF antenna and the superband signals from the cable input at the same node in the television set, but it is by no means obvious how that can be done and at the same time prevent any of the cable television signals from interfering with the VHF signals, or vice versa, when the VHF or superband tuners are respectively rendered operative.

Each of the individual tuner assemblies, to be operative, must be provided with a supply voltage, and for purposes of economy and long life that supply voltage should be applied only to the tuner actually being used and not to the tuners that are not being used at any given point in time.

In accordance with the present invention all of these problems and advantages are harmonized and rendered cooperative and effective through the use of a group of appropriately located and oriented voltage sensitive switching devices such as switching diodes, preferably actuated between connection and disconnection (closed-circuit and open-circuit) conditions by the same selective swtiching means which directs the supply voltage to the particular tuner which it is desired to energize and use at any given time.

The prime object of the present invention is therefore to provide a switching system for a multiband tuning system utilizing a plurality of tuning units, in which the switching is effected by voltage-sensitive switching devices and in which, preferably, the switching voltage is provided by the same instrumentality that provides for energizing that particular tuner.

It is another object of the present invention to provide a tuner capable of tuning at least the VHF and superband areas, and in which a portion of the existing VHF tuner is used in conjunction with one of the other tuners, an effective and efficient voltage-sensitive switching arrangement for selectively energizing the tuner sections and effecting the necessary electrical interconnections to make those tuner sections operative.

It is another object of the present invention to provide, in a combination VHF-superband tuner, a single node to which the VHF and superband signals are delivered, and to provide a voltage-sensitive switching arrangement for ensuring that the superband and VHF signals are delivered to the superband and VHF tuners respectively when those tuners are appropriately energized, without any interference from the non-operative signal.

SUMMARY OF THE INVENTION

These objectives and others are achieved by an appropriate circuit interconnection of the various tuner elements, antennas and voltge-sensitive diodes and the appropriate application thereto of the energizing voltages for the respective tuners. More specifically, as here disclosed, the VHF antenna and the cable which provides the superband signal are both connected to a common node which is in turn connected to the signal input of the superband tuner by a voltage-sensitive diode poled to be conductive when an actuating voltage is applied to the superband-tuner-side of that diode. The common node is also connected to the signal input to the channel 2-13 section A" of the VHF tuner, and a second voltage-sensitive diode is connected between the VHF signal line and ground. That second diode has a D.C. connection to the common node, and is poled so as to be conductive when acutating voltge is applied to the node-side of that diode. The output of the superband tuner is connected to the input of the channel 1 section of the VHF tuner by a third voltage-sensitive diode poled to be conductive when an acutating voltage is applied to the superband-tuner-side of that diode. An input terminal of the UHF tuner is connected to the channel 1 input of the VHF tuner by a fourth voltage sensitive diode poled to be conductive when an actuating voltage is applied to the UHF-tuner-side thereof. When an energizing voltage is applied to the superband tuner, that same voltage is applied to the superband-tuner-sides of the first and third voltage-sensitive diodes, rendering those diodes conductive, as a result of which the same actuating voltage is applied to the common node, thereby, through the D.C. connection between that node and the second voltage sensitive diode, rendering that second voltage-sensitive diode conductive. When VHF is to be received, energizing voltage is removed from the superband tuner, thus rendering the first, second and third semi-conductor diodes non-conductive, and an energizing voltage is applied to the VHF tuner. In both of these situations no actuating voltage is applied to the fourth semiconductor diode, and hence it remains non-conductive. When an energizing voltage is applied to the UHF tuner, that voltage is also applied to the UHF-tuner side of the fourth semiconductor diode, rendering that diode conductive, while the first, second and third semiconductor diodes remain non-conductive. Hence through the use of but four semiconductor diodes, strategically placed and arranged, all of the necessary switching actions to render either the VHF tuner, the UHF tuner or the superband tuner operative, are carried out, despite the switching complication inherent in using a common node for bringing in VHF and superband signals and using the channel 1 section of the VHF tuner in conjunction with both the superband and the UHF tuners.

BRIEF DESCRIPTION OF THE DRAWINGS

To the accomplishment of the above, and to the accomplishment of such other objects as may hereinafter appear, the present invention relates to an electrical connection system for a plurality of tuners by means of which the individual tuners are appropriately electrically interconnected in an effective, efficient and reliable manner, as defined in the appended claims and as described in this specification, taken together with the accompanying drawings, in which:

FIG. 1 is a schematic block diagram showing one embodiment of the instant invention; and FIG. 2 is a circuit diagram showing more in detail certain circuit portions of the preferred embodiment.

DETAILED DESCRIPTION OF THE PREFERRED EMBODIMENTS

As here specifically disclosed, the automatic switching circuitry is designed to function in conjunction with a VHF tuner generally designated A, a UHF tuner generally designated B, and a superband tuner generally designated C, the VHF tuner having a channel 1 section generally designated A' and a channel 2-13 section generally designated A". The VHF tuner has an input 2 to its channel 1 in section A', an input 4 to its channel 2-13 section A" and a common output 6 which is connected in any appropriate manner to the television tube 8. The VHF tuner A also has a supply voltage terminal 10 for its Channel 1 section A and a supply voltage terminal 12 for its Channel 2-13 section A" (the teminals 10 and 12 are shown in this fashion schematiclly, in order to simplify the description of the operation of the system of the present invention. In fact there may be a single supply voltage terminal which, through suitable internal electrical connection, will perform the desired energization functions for the channel 1 section A' and the channel 2-13 section A").

The UHF tuner B, designed to function in conjunction with the VHF Channel 1 section A', is provided with an antenna input terminal 14, an output terminal 16, and a supply voltage terminal 18. The output terminal 16 is connected through the VHF tuner is an appropriate manner to the television tube 8, the channel 1 section A' serving to amplify the UHF output.

The superband tuner C is provided with a signal input terminal 22, an output terminal 24, and a supply voltge terminal 26.

The VHF antenna 28 or the cable 30 which brings in the superband signal are connected to a common node 32. The UHF antenna 34 is connected to the UHF antenna input 14.

The node 32 is connected to the input terminal 4 for the channel 2-13 VHF tuner section A" by means of a low pass filter 44 which is capable of passing signals having a frequency within the VHF band but rejecting signals having the higher frequency characteristic of superband signals. The node 32 is connected to the superband tuner C by means of a band pass filter 36 capable of passing frequencies within the superband spectrum but rejecting frequencies within the lower VHF spectrum. (It is a matter of semantics whether the band pass filter 36 is considered to be part of the superband tuner C or not, and hence the reference numeral 22, designating the signal input terminal of the superband tuner C, is shown in FIG. 1 as applied to points both before and after the band pass filter 36.)

The superband tuner C, as is known in the art, is so designed as to convert the superband signals to an appropriate intermediate frequency signal, which intermediate frequency signal, constituting the output of the superband tuner C, is conveyed to the VHF channel 1 section A', where that intermediate frequency signal is converted into a signal appropriate to properly control the operation of the television tube 8, hence the connection 38 between the superband tuner output terminal 24 and the channel 1 section input terminal 2.

It is also well known, in combination VHF-UHF tuner assemblies, to use certain signals generated in the UHF tuner B to be amplified by channel 1 of VHF section A' in order to produce an output capable of properly controlling the television tube 8, hence the connection 40 between the VHF channel 1 section terminal 2 and the UHF tuner output terminal 16.

Each of the tuners requires a supply voltage for energization. As here schematically disclosed, that supply or energizing voltage is selectively applied to the tuners section A", B and C by means of a selector switch D, usually but not necessarily manually controlled. That selector switch D selectively interconnects a B+ source 42 of energizing voltge to the appropriate tuners. The channel 1 section A' is always connected, by lead 45, to the B+ source 42. The selector switch D is here shown as having three positions, a UHF position, a channel 2-13 VHF position and a superband position. In the UHF position the supply voltage is applied to terminal 47, terminal 47 being electrically connected to the supply voltage terminal 18 of the UHF tuner B. The channel 2-13 VHF position of the switch D has a terminal 46, which is electrically connected to the supply voltage input terminal 12 for the VHF channel 2-13 section A". The superband position of the switch D has a terminal 48 electrically connected to the supply voltage input terminal 26 of the superband tuner C. The circuitry of the superband tuner C is such that when a supply voltage is applied to its supply voltage input terminal 26, that voltage is also applied at its signal input terminal 22 on the far side of the band pass filter 36 and also to the signal output terminal 24.

To effect the appropriate electrical inerconnections in accordance with the present invention four voltage-sensitive switching units, and more specifically voltage sensitive diodes, designated CR1, CR2, CR3, and CR4 are employed. CR1 is connected between the VHF-superband signal node 32 and the input 22 to the superband tuner C, and is poled or oriented so as to become conductive when an actuating voltage is applied to the superband-tuner-side thereof. Voltage sensitive diode CR2 is connected between ground and the output of the low pass filter 44, is poled so as to become conductive when an actuating voltage is applied to the side thereof away from ground, and a D.C. connection is provided between that away-from-ground side and the node 32. As a result, when an actuating voltage is applied to the superband-tuner-side of the first diode CR1, rendering that diode conductive, that same actuating voltage is applied to the node 32 and, through the aforementioned D.C. connection, to the second diode CR2 to render that second diode conductive, thus shorting to ground the output of the low pass filter 44.

A third voltage-sensitive diode CR3 is connected between the superband tuner output terminal 24 and the VHF chanel 1 section input terminal 2, and is poled to become conductive when an actuating voltage is applied to its superband-tuner-side. A fourth voltage sensitive diode CR4 is connected between the channel 1 section terminal 2 and the UHF tuner output terminal 16, and is poled to become conductive when an actuating voltage is applied to the UHF-tuner-side thereof, and an appropriate connection 50, either internal of the UHF tuner B or external thereof, is provided between the terminal 47 of the switch D and the UHF-tuner-side of the fourth diode CR4.

FIG. 2 illustrates more in detail some of the connections associated with the superband tuner C and the diodes CR1, CR2, CR3 and CR4. The band pass filter 36 is disclosed as being composed of the inductances 52, 54 and 62 and the capacitors 56, 58 and 60. The low pass filter 44 is disclosed as being composed of the inductors 62, 77 and the capacitor 64 connected in series between the node 32 and ground, and the second voltagesensitive diode CR2 is connected between ground and a point 66 between the inductance 62 and the inductance 77, thus providing a D.C. connection between the upper side of the diode CR2 and the node 32. A.D.C. is isolating capacitor 68 is preferably connected between the node 32 and the connections to the VHF antenna 28 or the superband signal cable 30, and a D.C. isolating capacitor 70 is preferably connected between the point 66 and the connection 72 to the signal input terminal 4 of the VHF channel 2-13 section A". The supply voltage for the superband tuner C is fed from the supply terminal 26 to the point 22 on the superband-tuner-side of the first voltage sensitive diode CR1, and it is also fed, via connector 74, through the output transformer 76 of the superband tuner C to point 24, which is connected to the superband-tuner-side of the third voltage-sensitive diode CR3.

The operation of the automatic switching system of the present invention will in the main be apparent from the description above. When superband reception is desired the switch D is placed in its superband position, thus providing supply voltage to the terminals 48. As a result the superband tuner C is energized, and the first and third voltage sensitive diodes CR1 and CR3 are rendered conductive because the supply voltage B+ which consitutes the actuating voltage for those diodes is applied to the superband-tuner-sides thereof. Because diode CR1 becomes conductive, that supply voltage is also applied through the node 32 and, through the inductance 62, to the nodeside of the second voltage-sensitive diode CR2, rendering that diode conductive. The now conductive diode CR1, acting in conjunction with the band pass filter, enables superband signals to reach the superband tuner C, now energized because it is provided with supply voltage, and the now conductive diode CR2 shorts to ground all VHF signals. The now conductive diode CR3 permits the I F output signals from the superband tuner C to reach the VHF channel 1 section A', there to be converted into signals appropriate to control the television tube 8. Hence the assembly functions to receive only the superband signals and to convert them into visible form on the television tube 8.

When the selector switch D is shifted to its VHF position the supply voltage is applied only to the terminal 46, thus energizing the VHF channel 2-13 section A". Because supply voltage is now removed from the superband tuner C, it is also removed from the superband-tuner-sides of the diodes CR1 and CR3, rendering those diodes non-conductive, and because diode CR1 is non-conductive, the actuating voltage is removed from the node-side of diode CR2, rendering that diode non-conductive. As a result the VHF signals which emanate from the low pass filter 44 are no longer shorted to ground, but instead are fed to the channel 2-13 input terminal 4, the VHF tuner A then converting them into signals appropriate to control the television tube 8.

When the selector switch D is moved to its UHF position the supply voltage is applied to the terminal 47 thus energizing the UHF tuner and applying an actuating voltage to the UHF-tuner-side of the fourth voltage-sensitive diode CR4, rendering that diode conductive. In this condition of the switch D the diodes CR1, CR2 and CR3 remain non-conductive. Hence only the UHF tuner is energized.

From the above it is seen that merely by actuating the selector switch D, something which must in any event be done in order to energize the desired tuner, the necessary relatively complex switching between antennas and different sections of different tuners is effected reliably, without moving parts and with a minimum of added circuitry.

While but a single embodiment of the present invention has been here specifically disclosed, and while that disclosure has been in connection with a particular number and type of tuners and a particular interaction between sections of at least some of those tuners, the instant invention is adoptable for use with other specific tuners and combinations thereof, and with fewer or greater numbers of tuners, all as will be apparent to those skilled in the art. Accordingly, variations in the embodiment here specifically disclosed may be made without departing from the spirit of the invention as defined in the following claims.

We claim:

1. In a communication system for first and second signal bands and comprising first and second tuner assemblies for said first and second bands respectively and a third tuner assembly cooperable with said second tuner assembly to render the latter operative, first and second means for receiving signals for said first and second bands respectively, and means for selectively energizing (a) said first tuning assembly; and (b) said second and third tuning assemblies; the automatic switching arrangement comprising means connecting said first signal receiving means and said second signal receiving means to a node, first voltage sensitive switching means operatively connected between said node and said second tuner assembly, second voltage sensitive switching means operatively connected between said node and said first tuner assembly, third voltage sensitive switching means operatively connected between said second tuner assembly and said third tuner assembly, and means operatively connecting said selective energizing means and said first through third voltage sensitive switching means and effective (a) when said first tuner is energized to actuate said first and third voltage sensitive switching means to disconnect and to actuate said second voltage sensitive switching means to connect; and (b) when said second tuner is energized to actuate said second voltage sensitive switching means to disconnect and to actuate said first and third voltage sensitive switching means to connect.

2. A communication system of claim 1, in which said first tuner assembly tunes a plurality of VHF channels, said second tuner assembly tunes one or more superband channels, and said third tuner assembly comprises a selected channel portion of a VHF tuner assembly.

3. The communication system of claim 1, in which said voltage sensitive switching means comprises voltage sensitive diodes and the actuating means for said diodes is a voltage provided by said energizing means.

4. The communication system of claim 1, in which said node is connected to said second tuner assembly by a first filter capable of passing signals appropriate to said second tuner assembly but rejecting signals appropriate to said first tuner assembly, said node is connected to said first tuner assembly by a second filter capable of passing signals appropriate to said first tuner assembly but rejecting signals appropriate to said second tuner assembly, and said second voltage sensitive switching means is connected to said second filter and is effective, when actuated to disconnect, to prevent signals appropriate to said first tuner assembly from reaching said first tuner assembly.

5. The communication system of claim 4, in which said second voltage sensitive means is connected to said second filter in such a fashion as when conductive to connect the output of said filter to ground, thereby to prevent signals emanating from said second filter from reaching said first tuner assembly, said second voltage sensitive means when conductive thus being actuated to disconnect said first tuner assembly from said second filter.

6. A communication system comprising a VHF tuner having a channel 1 section and a channel 2–13 section, and a superband tuner, a node to which VHF and superband signals are applied, a connection between said node and an input to said superband tuner comprising a first voltage-sensitive diode rendered conductive when an actuating voltage is applied to the superband-tuner-side thereof, a connection between said node and an input to said channel 2–13 section of said VHF tuner comprising a second voltage-sensitive-diode connected between said channel 2–13 input and ground and rendered conductive when an actuating voltage is applied to the node-side thereof, a connection between an output of said superband tuner and said channel 1 section of said VHF tuner comprising a third voltage-sensitive-diode rendered conductive when an actuating voltage is applied to the superband-tuner-side thereof, and means for selectively energizing said tuners, said means being effective (a) when said superband tuner is energized to supply an actuating voltage to the superband-tuner-side of said first and third voltage sensitive diodes; and (b) when said channel 2–13 section of said VHF tuner is energized to not supply an actuating voltage to any of said voltage sensitive diodes.

7. The communication system of claim 6, in which D.C. isolation capacitors are connected between said node and said first voltage sensitive diode and between said input to said channel 2–13 section of said VHF tuner and said node-side of said second voltage sensitive diode.

8. The communication system of claim 6, in which a band pass filter is connected between said node and said input to said superband tuner and a low pass filter is connected between said node and said input to said channel 2–13 section of said VHF tuner, said low pass filter comprising an inductance connected to said node, said node-side of said second voltage sensitive diode having a D.C. connection to said inductance.

9. In a communication system for first, second and third signal bands and comprising first, second and third tuner assemblies for said first, second and third signal bands respectively and a fourth tuner assembly cooperable selectively with said second and third tuner assemblies to render the latter operative, first, second and third means for receiving signals for said first, second and third bands respectively, and means for selectively energizing (a) said first tuning assembly, (b) said second and fourth tuning assemblies, and (c) said third and fourth tuning assemblies; the automatic switching arrangement comprising means connecting said first signal receiving means and said third signal receiving means to a node, first voltage sensitive switching means operatively connected between said node and said third tuner assembly, second voltage sensitive switching means operatively connected between said node and said first tuner assembly, third voltage sensitive switching means operatively connected between said third tuner assembly and said fourth tuner assembly, means connecting said second signal receiving means to said second tuner assembly, and a fourth voltage sensitive switching means operatively connected between said second tuner assembly and said fourth tuner assembly, and means operatively connecting said selective energizing means and said first through fourth voltage sensitive switching means and effective (a) when said first tuner is energized to actuate said first, third and fourth voltage sensitive switching means to disconnect and to actuate said second voltage sensitive switching means to connect; (b) when said second tuner is energized to actuate said first, second and third voltage sensitive switching means to disconnect and to actuate said fourth voltage sensitive switching means to connect; and (c) when said third tuner is energized to actuate said second and fourth voltage sensitive switching means to disconnect and to actuate said first and third voltage sensitive switching means to connect.

10. The communication system of claim 9, in which said first tuner assembly tunes a plurality of VHF channels, said second tuner assembly tunes a plurality of UHF channels, and said third tuner assembly tunes one or more superband channels.

11. The communication system of claim 10, in which said fourth tuner assembly comprises a selected channel portion of a VHF tuner assembly.

12. The communication system of claim 9, in which said voltage sensitive switching means comprise voltage sensitive diodes and the actuating means for said diodes is a voltage provided by said energizing means.

13. The communication system of claim 9, in which said node is connected to said third tuner assembly by a first filter capable of passing signals appropriate to said third tuner assembly but rejecting signals appropriate to said first tuner assembly, said node is connected to said first tuner assembly by a second filter capable of passing signals appropriate to said first tuner assembly but rejecting signals appropriate to said third tuner assembly, and said second voltage sensitive switching means is connected to said second filter and is effective, when actuated to disconnect, to prevent signals appropriate to said first tuner assembly from reaching said first tuner assembly.

14. The communication system of claim 13, in which said second voltage sensitive means is connected to said second filter in such a fashion as when conductive to connect the output of said filter to ground, thereby to prevent signals emanating from said second filter from reaching said first tuner assembly, said second voltage sensitive means when conductive thus being actuated to disconnect said first tuner assembly from said second filter.

15. The communication system of claim 13, in which said voltage sensitive switching means comprise voltage sensitive diodes and the actuating means for said diodes is a voltage provided by said energizing means.

16. The communication system of claim 9, in which said first voltage sensitive switching means is connected between said node and an input to said third tuner assembly, said second voltage sensitive switching means is connected between ground and the input to said first tuning assembly, said third voltage sensitive switching means is connected between the output of said third tuning assembly and said fourth tuning assembly, and said fourth voltage sensitive switching means is connected between said fourth tuning assembly and an input to said second tuning assembly.

17. The communication system of claim 16, in which said voltage sensitive switching means comprise voltage sensitive diodes and the actuating means for said diodes is a voltage provided by said energizing means.

18. Communication system of claim 17, in which said node is connected to said third tuner assembly by a first filter capable of passing signals appropriate to said third tuner assembly but rejecting signals appropriate to said first tuner assembly, said node is connected to said first tuner assembly by a second filter capable of passing signals appropriate to said first tuner but rejecting signals appropriate to said third tuner, and said second voltage sensitive switching means is connected to said second filter and is effective, when actuated to disconnect, to prevent signals appropriate to said first tuner from reaching said first tuner.

19. The communication system of claim 18, in which said second voltage sensitive means is connected to said second filter in such a fashion as when conductive to connect the output of said filter to ground, thereby to prevent signals emanating from said second filter from reaching said first tuner, said second voltage sensitive means when conductive thus being actuated to disconnect said first tuner from said second filter.

20. Communication system of claim 16, in which said node is connected to said third tuner assembly by a first filter capable of passing signals appropriate to said third tuner assembly but rejecting signals appropriate to said first tuner assembly, said node is connected to said first tuner assembly by a second filter capable of passing signals appropriate to said first tuner but rejecting signals appropriate to said third tuner, and said second voltage sensitive switching means is connected to said second filter and is effective, when actuated to disconnect, to prevent signals appropriate to said first tuner from reaching said first tuner.

21. The communication system of claim 20, in which said second voltage sensitive means is connected to said second filter in such a fashion as when conductive to connect the output of said filter to ground, thereby to prevent signals emanating from said second filter from reaching said first tuner, said second voltage sensitive means when conductive thus being actuated to disconnect said first tuner from said second filter.

22. A communication system comprising a VHF tuner having a channel 1 section and a channel 2–13 section, a UHF tuner, and a superband tuner, a node to which VHF and superband signals are applied, a connection between said node and an input to said superband tuner comprising a first voltage-sensitive diode rendered conductive when an actuating voltage is applied to the superband-tuner-side thereof, a connection between said node and an input to said channel 2–13 section of said VHF tuner comprising a second voltage sensitive diode connected between said channel 2–13 input and ground and rendered conductive when an actuating voltage is applied to the node-side thereof, a connection between an output of said superband tuner and said channel 1 section of said VHF tuner comprising a third voltage sensitive diode rendered conductive when an actuating voltage is applied to the superband-tuner-side thereof, a connection between said channel 1 section and an output of said UHF tuner comprising a fourth voltage sensitive diode rendered conductive when an actuating voltage is applied to the UHF-tuner-side thereof, and means for selectively energizing said tuners, said means being effective (a) when said superband tuner is energized to supply an actuating voltage to the superband-tuner-side of said first and third voltage sensitive diodes; (b) when said channel 2–13 section of said VHF tuner is energized to not supply an actuating voltage to any of said voltage sensitive diodes, and (c) when said UHF tuner is energized to supply an actuating voltage to the UHF-tuner-side of said fourth voltage sensitive diode.

23. The communication system of claim 22, in which D.C. isolation capacitors are connected between said node and said first voltage sensitive diode and between said input to said channel 2–13 section of said VHF tuner and said node-side of said second voltage sensitive diode.

24. The communication system of claim 23, in which a band pass filter is connected between said node and said input to said superband tuner and a low pass filter is connected between said node and said input to said channel 2–13 section of said VHF tuner, said low pass filter comprising an inductance connected to said node, said node-side of said second voltage-sensitive diode having a D.C. connection to said inductance.

25. The communication system of claim 22, in which a band pass filter is connected between said node and said input to said superband tuner and a low pass filter is connected between said node and said input to said channel 2–13 section of said VHF tuner, said low pass filter comprising an inductance connected to said node, said node-side of said second voltage-sensitive diode having a D.C. connection to said inductance.

* * * * *